(12) United States Patent
Kwon

(10) Patent No.: US 6,353,349 B1
(45) Date of Patent: Mar. 5, 2002

(54) PULSE DELAY CIRCUIT WITH STABLE DELAY

(75) Inventor: Jungtae Kwon, San Jose, CA (US)

(73) Assignee: Integrated Silicon Solution Incorporated, Santa Clara, CA (US)

(*) Notice: Subject to any disclaimer, the term of this patent is extended or adjusted under 35 U.S.C. 154(b) by 0 days.

(21) Appl. No.: 09/102,712

(22) Filed: Jun. 22, 1998

(51) Int. Cl.[7] .................................................. H03K 5/01

(52) U.S. Cl. ....................................... 327/165; 327/172

(58) Field of Search ................................. 327/263, 268, 327/269, 284, 290, 172, 174, 291, 165

(56) References Cited

U.S. PATENT DOCUMENTS 5,646,565 A * 7/1997 Tukidate ..................... 327/174
5,723,993 A * 3/1998 Cha ............................. 327/172

* cited by examiner

*Primary Examiner*—Toan Tran
*Assistant Examiner*—Cassandra Cox
(74) *Attorney, Agent, or Firm*—Pennie & Edmonds LLP

(57) ABSTRACT

A pulse delay circuit that provides a delay for a pulsed input signal that does not vary significantly under changing temperature, power supply voltage or process conditions. The delay provided by the pulse delay circuit is not significantly limited in duration. The pulse delay circuit includes a pulse detector, an RC delay circuit and a pulsed signal generator. The delay is primarily determined by the RC time constant of the RC delay circuit.

10 Claims, 7 Drawing Sheets

PULSE DELAY CIRCUIT WITH STABLE DELAY

The present invention relates generally to delay circuits and, particularly, to delay circuits that provide a stable delay for a wide range of operating and process conditions.

BACKGROUND OF THE INVENTION

A delay circuit generates an output signal characterized by selected signal transitions that are delayed from corresponding transitions of a pulsed input signal. Delay circuits are widely used in all types of electronic circuits, including integrated circuits such as digital memories. Ideally, a given delay circuit should provide a constant delay for a wide range of operating conditions. This is a challenge, as most delay circuits used in integrated circuits comprise transistors, logic gates and/or op amps, whose switching performance is highly dependent on the operating temperature and power supply voltage ($V_{DD}$), which are likely to vary during operation. For example, the operating temperature can vary between −10 degrees Centigrade (° C.) and 100° C. and $V_{DD}$ for a 3.3 volt (V) integrated circuit can vary between 2.8 V and 3.8 V. Another factor affecting delay circuits is process variation. For example, a delay circuit performs differently depending on whether the fabrication process is fast or slow (i.e., produces fast or slow transistors) and on whether the p-channel and n-channel transistors have symmetrical or asymmetrical characteristics.

FIG. 1 is a schematic diagram of a prior art delay circuit 5 that can be implemented as part of an integrated circuit. Delay circuit 5 comprises eight (or any even number) inverters I1, I2, . . . , I8 connected in a chain. The delay between the input IN and the output OUT of the delay circuit 5 can be varied by changing the number of inverters in the chain or by adjusting the size (i.e., the channel width and length) of the transistors in the inverters.

Unfortunately, the delay produced by the delay circuit 5 is highly sensitive to variations in temperature, power supply voltage and process. The delay of the delay circuit 5 is largely determined by the current drive and logic threshold of the inverters I1 to I8 in the delay circuit. Since these inverter characteristics are highly dependent upon temperature, power supply voltage and process conditions, the delay of the delay circuit can vary significantly.

FIG. 2 is a schematic diagram of a second prior art delay circuit 10. Delay circuit 10 comprises a resistor R and a capacitor C arranged in an RC network configuration. The delay between the input IN and the output OUT of the delay circuit 10 is determined by the time constant R*C, where R is the resistance of the resistor R and C is the capacitance of the capacitor C. More specifically, if a 0 V to $V_{DD}$ step input signal is applied to the input IN, the output OUT reaches a voltage of 0.63*$V_{DD}$ in the time R*C. Therefore, the delay of the delay circuit 10 can be adjusted by varying the values of the resistor R and capacitor C appropriately.

Unlike the delay circuit 5 mentioned earlier, the delay circuit 10 provides a delay that is relatively stable despite changes in temperature, power supply voltage or process. This is because the delay is determined by the values of the resistor R and capacitor C, which are not highly sensitive to changes in temperature, power supply voltage or process.

However, the maximum delay that the delay circuit 10 can produce for an input pulse signal is limited. Specifically, the delay circuit 10 cannot produce a delay greater than the duration of the input pulse. If the time constant of the delay circuit 10 is set to produce a delay greater than the input pulse duration, the delay circuit will not transfer the input pulse to the output. Due to its relatively slow rise time, the output of the delay circuit will not have sufficient time to rise to the voltage representing a logical "1" before the end of the input pulse.

Therefore, there is a need for a delay circuit that provides a delay that is stable over a wide range of temperature, power supply voltage and process conditions. In addition, the delay circuit should be able to provide a delay that is not significantly limited in duration.

SUMMARY OF THE INVENTION

In summary, the present invention is a pulse delay circuit that provides a delay for a pulsed input signal that does not vary significantly under changing temperature, power supply voltage or process conditions. Furthermore, the delay provided by the pulse delay circuit is not significantly limited in duration.

The pulse delay circuit of the present invention comprises a pulse detector, an RC delay circuit coupled to the pulse detector and a pulsed signal generator coupled to the RC delay circuit. The pulse detector includes an input for receiving a pulsed signal and an output for generating a leveled signal that transitions between a first voltage and a second voltage (i.e., from the first voltage to the second voltage or vice versa) whenever the pulsed signal transitions from the first voltage to the second voltage. The RC delay circuit includes an input coupled to the output of the pulse detector and an output for generating a delayed leveled signal that transitions between the first voltage and the second voltage whenever the leveled signal transitions in the same direction, separated by a delay at least partially determined by an RC time constant associated with the RC delay circuit. The pulsed signal generator includes an input coupled to the output of the RC delay circuit and an output for generating a delayed pulsed signal containing a pulse of a predetermined width whenever the delayed leveled signal transitions in at least one direction between the first voltage and the second voltage. The delay of the pulse delay circuit is primarily determined by the RC time constant of the RC delay circuit.

In one embodiment of the present invention, the pulsed signal generator generates a pulse whenever the delayed leveled signal transitions from either the first voltage to the second voltage or the second voltage to the first voltage.

In an alternative embodiment of the present invention, the RC delay circuit further includes a second output for generating a second delayed leveled signal that transitions between the first voltage and the second voltage whenever the leveled signal transitions in the opposite direction, separated by a delay at least partially determined by a second RC time constant associated with the RC delay circuit. In addition, the pulsed signal generator further includes a second input coupled to the second output of the RC delay circuit, wherein the pulsed signal generator generates a pulse whenever either the first or second delayed leveled signal transitions from the first voltage to the second voltage.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

To overcome the shortcomings of prior art delay circuits, the delay circuit of the present invention comprises an RC network in combination with additional circuitry. This combination provides the stable delay characteristics of the RC network while also providing a longer maximum delay than is possible with the RC network alone.

Figure 1:
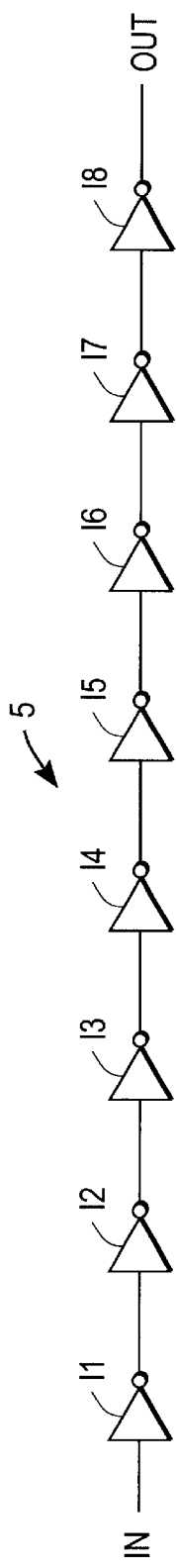
FIG. 1 is a schematic diagram of a prior art delay circuit that employs a chain of inverters.
Figure 2:
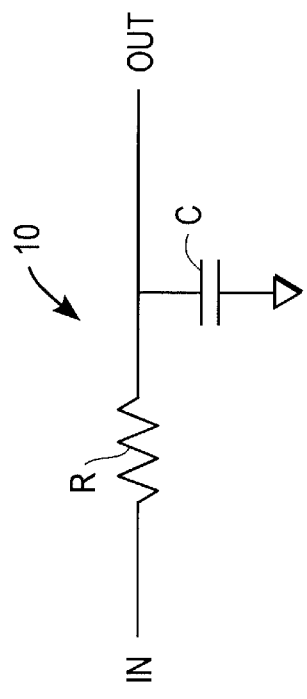
FIG. 2 is a schematic diagram of a prior art delay circuit that employs a resistor and a capacitor arranged in an RC network configuration.
Figure 3:
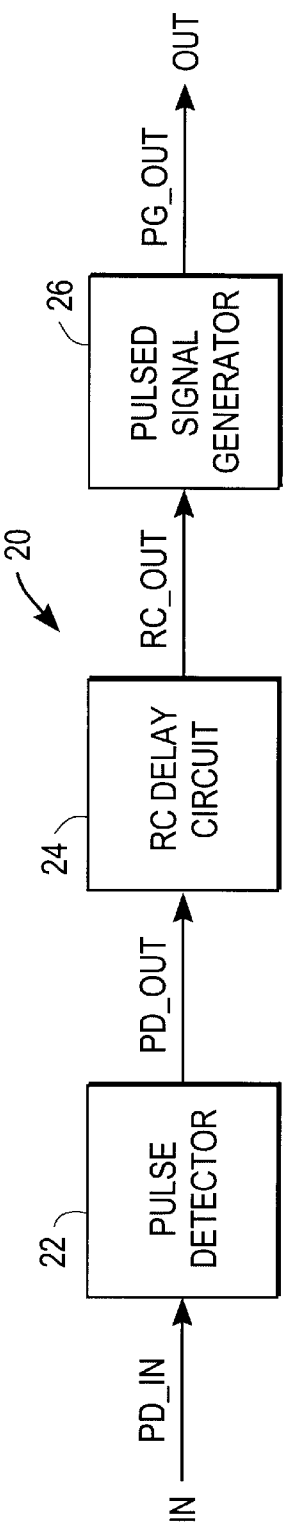
FIG. 3 is a simplified block diagram of a pulse delay circuit in accordance with the present invention.
Figure 5:
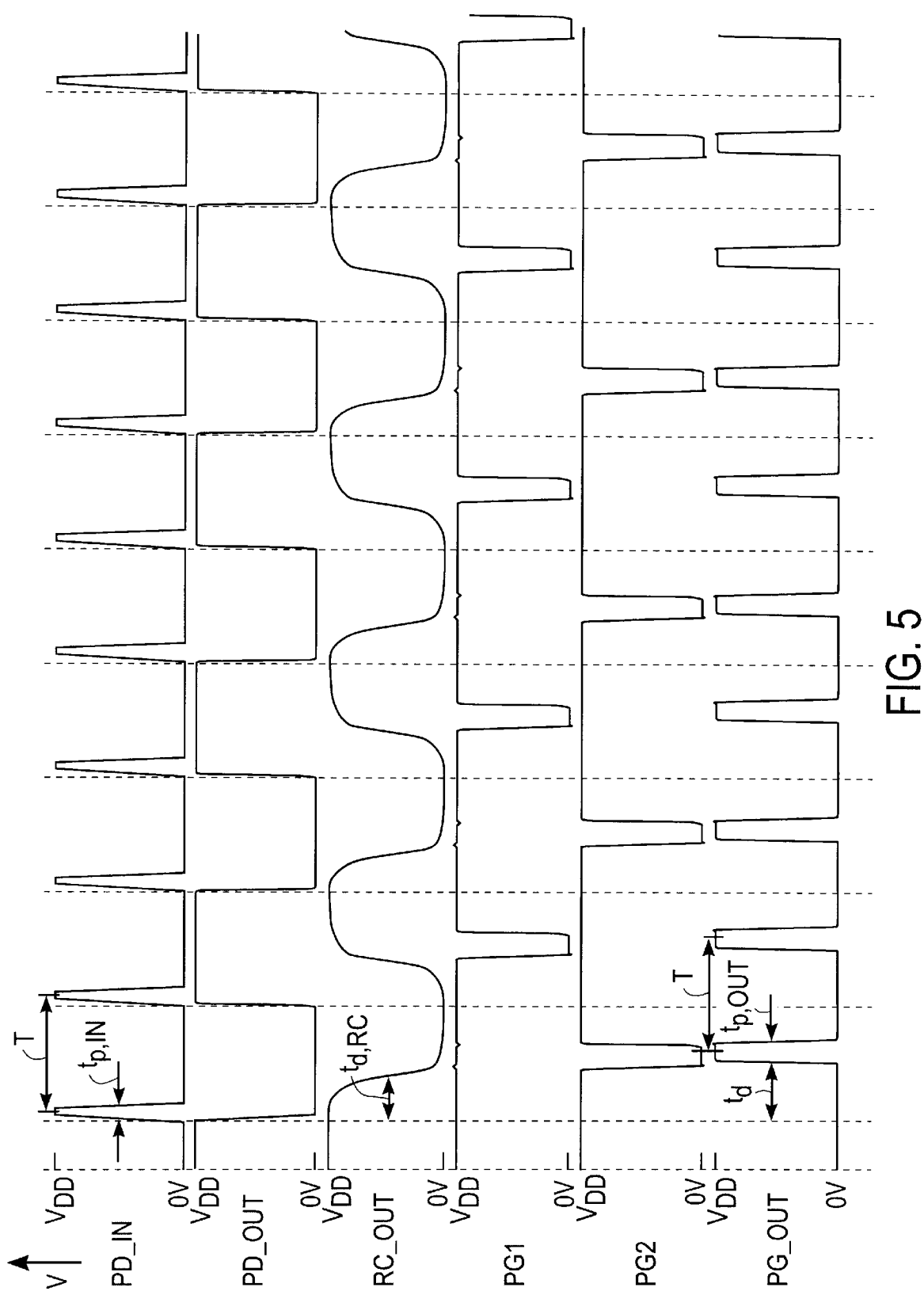
FIG. 5 is a timing diagram illustrating the input signal, internal signals and output signal for the pulse delay circuit shown in FIGS. 3 and 4 as a function of time.

FIG. 3 is a simplified block diagram of a pulse delay circuit 20 in accordance with the present invention. The pulse delay circuit 20 comprises an input IN, a pulse detector 22, an RC delay circuit 24, a pulsed signal generator 26 and an output OUT. The pulse delay circuit 20 produces a delay $t_d$ from the input IN to the output OUT. A periodic pulsed signal PD_IN, having a period T and a pulse width $t_{p,IN}$, is applied to the input IN of the pulse delay circuit 20. The pulse detector 22 receives the periodic pulsed signal PD_IN and outputs a periodic leveled signal PD_OUT. Next, the RC delay circuit 24 receives the periodic leveled signal PD_OUT and outputs a delayed periodic leveled signal RC_OUT. Lastly, the pulsed signal generator 26 receives the delayed periodic leveled signal RC_OUT and generates a delayed periodic pulsed signal PG_OUT, which is supplied to the output OUT of the pulse delay circuit 20. The delayed periodic pulsed signal PG_OUT output by the pulse delay circuit 20 is delayed from the periodic pulsed signal PD_IN input to the circuit by the delay $t_d$. FIG. 5 is a timing diagram showing the waveforms for the various signals associated with the pulse delay circuit 20.

The use of the pulse detector 22 enables the pulse delay circuit 20 to produce a maximum delay that is greater than that of the prior art delay circuit 10 described earlier. The pulse detector 22 converts the periodic pulsed signal PD_IN, which remains stable for a relatively short duration, into the periodic leveled signal PD_OUT, which remains stable for the entire signal period. The pulse detector 22 then provides the periodic leveled signal to the input of the RC delay circuit 24. Since the periodic leveled signal PD_OUT remains stable for the whole signal period, the output of the RC delay circuit 24 has approximately one signal period of time to rise to the voltage representing a logical "1" or fall to the voltage representing a logical "0" before the input transitions. As a result, the maximum delay $t_d$ that can be produced by the pulse delay circuit 20 is approximately equal to one signal period.

Figure 4:
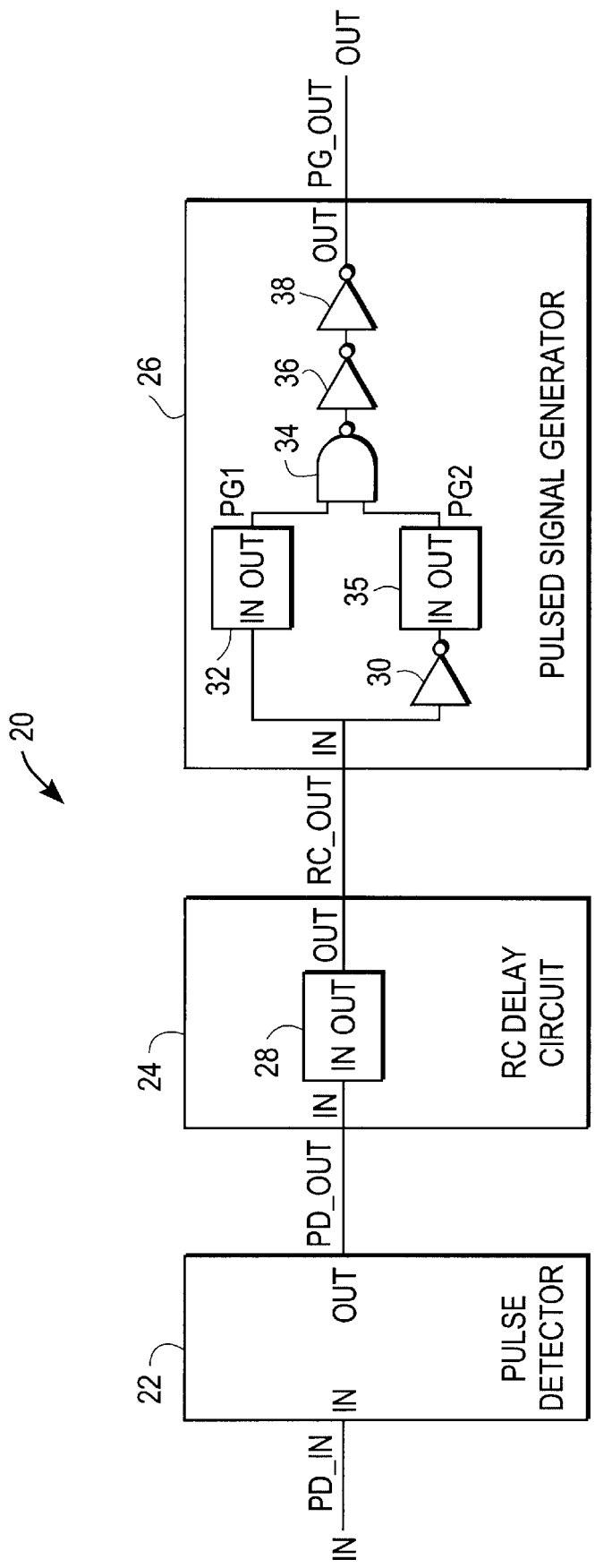
FIG. 4 is a schematic diagram of the pulse delay circuit shown in FIG. 3.

FIG. 4 is a schematic diagram of the pulse delay circuit 20 showing the circuit in greater detail. The pulse detector 22 includes an input IN for receiving the periodic pulsed signal PD_IN and an output OUT for generating the leveled signal PD_OUT. The leveled signal PD_OUT transitions between 0 V and $V_{DD}$ (i.e., from 0 V to $V_{DD}$ or vice versa) whenever the periodic pulsed signal PD_IN transitions from 0 V to $V_{DD}$ (i.e., a rising edge). In other words, the pulse detector 22 toggles its output whenever it detects the rising edge of a pulse at its input.

The RC delay circuit 24 comprises an input IN, an RC network 28 and an output OUT. The input IN is connected to the output OUT of the pulse detector 22. The RC network 28 comprises at least one resistor and at least one capacitor arranged in an RC network configuration. The RC network 28 is characterized by a time constant R*C, where R and C are the resistance and capacitance, respectively, of the network. The input IN of the RC delay circuit 24 is connected to the input of the RC network 28. The output of the RC network 28 is connected to the output OUT of the RC delay circuit 24.

The output OUT of the RC delay circuit 24 generates the delayed periodic leveled signal RC_OUT that transitions between 0 V and $V_{DD}$ (i.e., from 0 V to $V_{DD}$ or vice versa) whenever the input IN transitions in the same direction, separated by a delay $t_{d,RC}$ at least partially determined by the time constant R*C. The precise relationship between the time constant and the delay $t_{d,RC}$ depends on several factors, including the switching voltage $V_{inv}$ (i.e., the input voltage at which the output changes its state) of the devices receiving the delayed periodic leveled signal RC_OUT. The delay $t_{d,RC}$ may also differ for the rising and falling edges of the delayed periodic leveled signal RC_OUT due to the different current sourcing and sinking capabilities of the transistors that respectively charge and discharge the RC network. This is especially true for complementary metal-oxide semiconductor (CMOS) devices, where the p-channel and n-channel transistors typically have different current capacities.

The RC delay circuit 24 supplies the delay $t_d$ for the pulse delay circuit 20, except for a relatively small contribution by the various gate delays in the pulse delay circuit. Therefore, the delay $t_d$ may be adjusted by varying the resistance R and capacitance C of the RC network 28.

The pulsed signal generator 26 includes an input IN that is connected to the output OUT of the RC delay circuit 24. The pulsed signal generator 26 also includes an output OUT for generating the delayed periodic pulsed signal PG_OUT. The pulsed signal generator 26 creates the delayed periodic pulsed signal by generating a pulse of a predetermined width $t_{p,OUT}$ whenever the input IN transitions between 0 V and $V_{DD}$ (i.e., from 0 V to $V_{DD}$ or vice versa). The predetermined width of the pulses may be the same as, or different from, the width $t_{p,IN}$ of the pulses in the periodic pulsed signal PD_IN. In this manner, the pulsed signal generator 26 regenerates the pulses of the periodic pulsed signal PD_IN.

The pulsed signal generator 26 further includes first and second pulse generators 32 and 35, a NAND gate 34 and inverters 30, 36 and 38. The first and second pulse generators 32 and 35 generate a pulse of the predetermined width $t_{p,OUT}$ whenever the input IN transitions from 0 V to $V_{DD}$ (i.e., a rising edge). The input IN of the pulsed signal generator 26 is connected to both the input of the first pulse generator 32 and the input of the inverter 30. The output of the inverter 30 is connected to the input of the second pulse generator 35. The outputs of the first and second pulse generators 32 and 35 are connected to the first and second inputs of the NAND gate 34, respectively. The output of the NAND gate 34 is connected to the input of the inverter 36. The output of the inverter 36 is connected to the input of the inverter 38. The output of the inverter 38 is connected to the output OUT of the pulsed signal generator 26.

FIG. 5 is a timing diagram illustrating the operation of the pulse delay circuit 20. In this figure, the periodic pulsed signal PD_IN of period T is applied to the input IN of the pulse delay circuit 20. At each rising edge of the periodic pulsed signal, the pulse detector 22 toggles its output between 0 V and $V_{DD}$ to generate the periodic leveled signal PD_OUT. The RC delay circuit 24 reshapes the periodic leveled signal with a relatively slow rise time and fall time to generate the delayed periodic leveled signal RC_OUT. The delayed periodic leveled signal RC_OUT is delayed from the periodic leveled signal PD_OUT by the delay $t_{d,RC}$. At each rising edge of the delayed periodic leveled signal RC_OUT, the pulse generator 32 produces a pulse to generate the signal PG1. At each falling edge of the delayed periodic leveled signal RC_OUT, the pulse generator 35 produces a pulse to generate the signal PG2. The NAND gate 34 combines the signals PG1 and PG2 to generate the delayed periodic pulsed signal PG_OUT at the output OUT of the pulse delay circuit 20. The delayed periodic pulsed signal PG_OUT is delayed from the periodic pulsed signal PD_IN by the delay $t_d$.

As indicated in FIG. 5, the delayed periodic pulsed signal PG_OUT generated by the pulse delay circuit 20 is similar but not identical to the periodic pulsed signal PD_IN received at its input. The period T of the delayed periodic pulsed signal is the same as that of the periodic pulsed signal. However, the pulse width $t_{p,OUT}$ of the delayed periodic pulsed signal may be different from the pulse width $t_{p,IN}$ of the periodic pulsed signal. This is completely acceptable for most applications of the pulse delay circuit 20.

Figure 6:
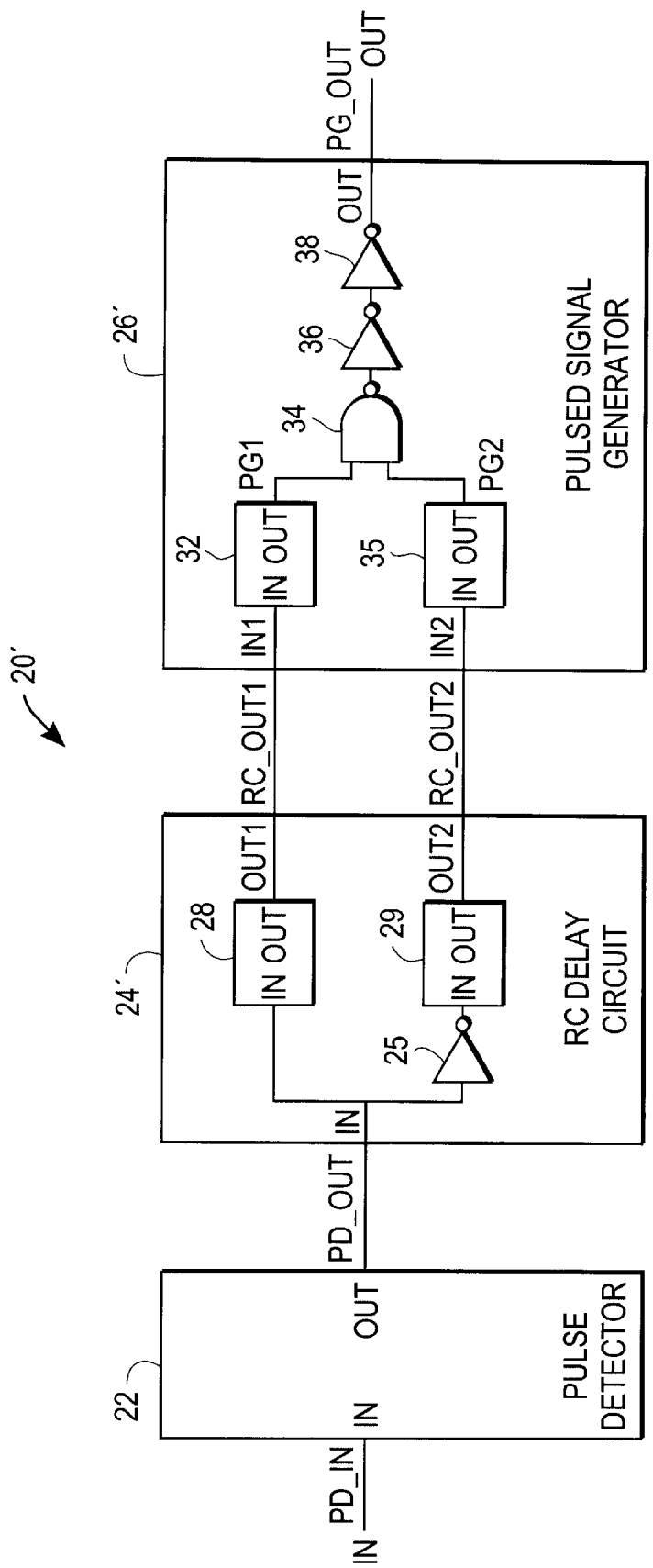
FIG. 6 is a schematic diagram of a pulse delay circuit in accordance with an alternative embodiment of the present invention.

FIG. 6 is a schematic diagram of a pulse delay circuit 20' in accordance with an alternative embodiment of the present invention. The pulse delay circuit 20' is similar to the pulse delay circuit 20 just described in that it comprises a pulse detector 22, an RC delay circuit 24' and a pulsed signal generator 26'. The pulse detector 22 is identical to that of the pulse delay circuit 20. However, the RC delay circuit 24' has been modified so that it outputs two delayed periodic leveled signals RC_OUT1 and RC_OUT2 of opposing phase rather than one. Also, the pulsed signal generator 26' has been modified so that it receives the two delayed periodic leveled signals RC_OUT1 and RC_OUT2 and generates pulses only on the rising edges of the delayed periodic leveled signals, rather than on both the rising and falling edges. These modifications enable the pulse delay circuit 20' to eliminate pulse-to-pulse variations in the period T of the delayed periodic pulsed signal PG_OUT that are caused by unequal delays $t_{d,RC}$ for the rising and falling edges of the delayed leveled signal RC_OUT.

Continuing to refer to FIG. 6, the RC delay circuit 24' comprises an input IN, first arid second RC networks 28 and 29, an inverter 25 and first and second outputs OUT1 and OUT2. As in the RC delay circuit 24, the RC networks 28 and 29 each comprise at least one resistor and at least one capacitor arranged in an RC network configuration. The first RC network 28 is characterized by a first time constant R1*C1, where R1 and C1 are the resistance and capacitance, respectively, of the first RC network. The second RC network 29 is characterized by a second time constant R2*C2, where R2 and C2 are the resistance and capacitance, respectively, of the second RC network.

The elements of the RC delay circuit 24' are connected as follows. The input IN of the RC delay circuit 24' is connected to the output OUT of the pulse detector 22. The input IN is also connected to both the input of the first RC network 28 and to the input of the inverter 25. The output of the first RC network 28 is connected to the first output OUT1 of the RC delay circuit 24'. The output of the inverter 25 is connected to the input of the second RC network 29. The output of the second RC network 29 is connected to the second output OUT2 of the RC delay circuit 24'.

The first and second outputs OUT1 and OUT2 generate the first and second delayed periodic leveled signals RC_OUT1 and RC_OUT2, respectively. The second delayed periodic leveled signal RC_OUT2 is approximately 180 degrees out of phase with the first delayed periodic leveled signal RC_OUT1. The first delayed periodic leveled signal RC_OUT1 transitions between 0 V and $V_{DD}$ (i.e., from 0 V to $V_{DD}$ or vice versa) whenever the input IN of the RC delay circuit 24' transitions in the same direction, separated by a first delay $t_{d,RC1}$ at least partially determined by the first time constant. The second delayed periodic leveled signal RC_OUT2 transitions between 0 V and $V_{DD}$ (i.e., from 0 V to $V_{DD}$ or vice versa) whenever the input IN of the RC delay circuit 24' transitions in the opposite direction, separated by a second delay $t_{d,RC2}$ at least partially determined by the second time constant. In the preferred embodiment, the first and second time constants are set to be approximately equal to provide the delayed periodic pulsed signal PG_OUT with a uniform delay $t_d$ from pulse to pulse.

The pulsed signal generator 26' includes first and second inputs IN1 and IN2 that are connected to the first and second outputs OUT1 and OUT2, respectively, of the RC delay circuit 24'. The pulsed signal generator 26' also includes an output OUT for generating the delayed periodic pulsed signal PG_OUT. The pulsed signal generator 26' creates the delayed periodic pulsed signal by generating a pulse of a predetermined width $t_{p,OUT}$ whenever either input IN1 or IN2 transitions from 0 V to $V_{DD}$ (i.e., a rising edge). The predetermined width $t_{p,OUT}$ of the pulses may be the same as, or different from, the width $t_{p,IN}$ of the pulses in the periodic pulsed signal PD_IN. In this manner, the pulsed signal generator 26' regenerates the pulses of the periodic pulsed signal PD_IN.

The pulsed signal generator 26' further includes first and second pulse generators 32 and 35, a NAND gate 34 and inverters 36 and 38. The first and second pulse generators 32 and 35 generate a pulse of the predetermined width $t_{p,OUT}$ whenever the respective inputs IN1 and IN2 transition from 0 V to $V_{DD}$ (i.e., a rising edge). The input IN1 of the pulsed signal generator 26' is connected to the input of the first pulse generator 32. The input IN2 of the pulsed signal generator 26' is connected to the input of the second pulse generator 35. The outputs of the first and second pulse generators 32 and 35 are connected to the first and second inputs of the NAND gate 34, respectively. The output of the NAND gate 34 is connected to the input of the inverter 36. The output of the inverter 36 is connected to the input of the inverter 38. The output of the inverter 38 is connected to the output OUT of the pulsed signal generator 26'.

Referring again to FIG. 5, the operation of the pulse delay circuit 20' is similar to that of the pulse delay circuit 20 described earlier, except that the signal RC_OUT is replaced by the complementary signals RC_OUT1 and RC_OUT2.

Figure 7:
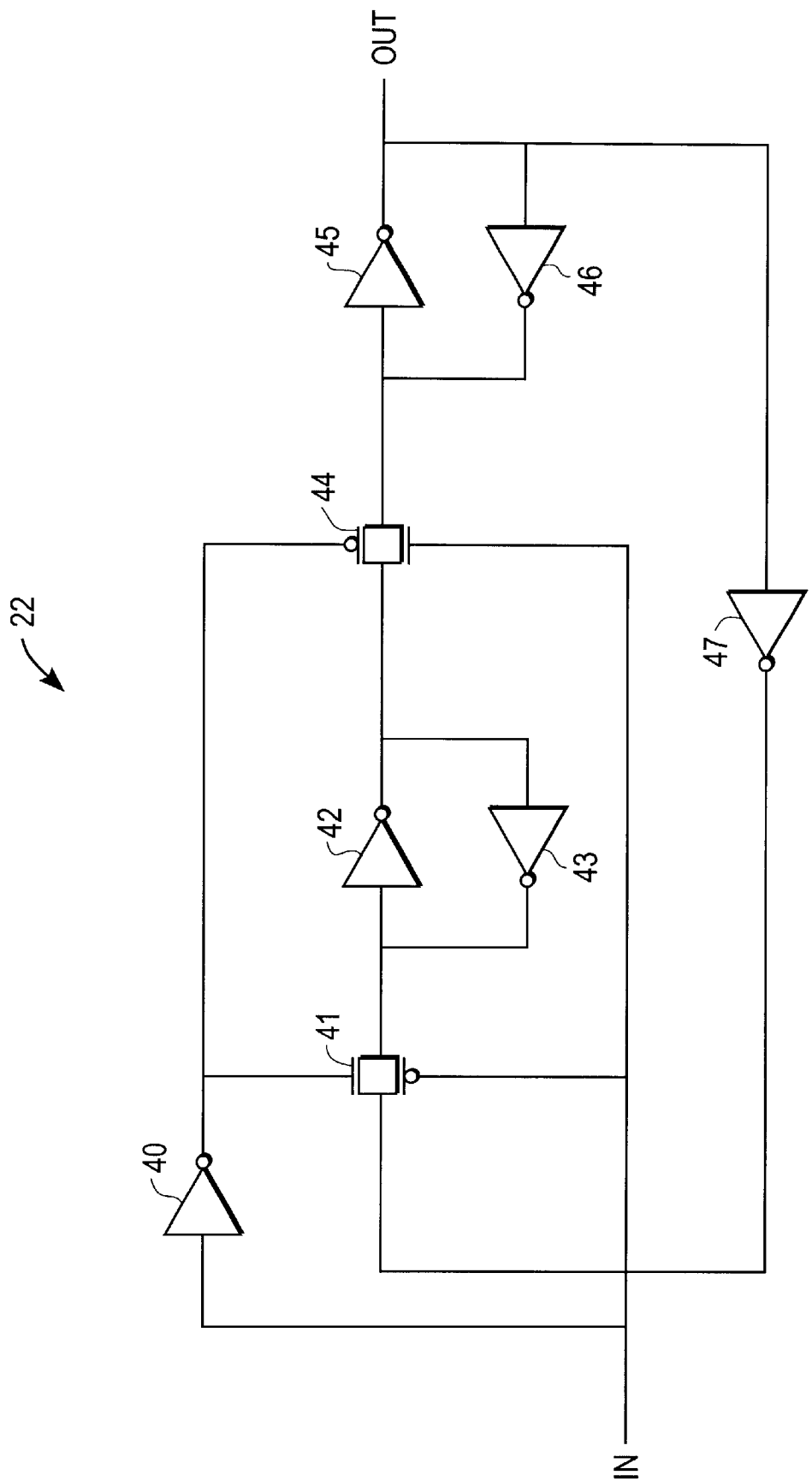
FIG. 7 is a schematic diagram of a preferred embodiment of the pulse detector shown in FIGS. 4 and 6.

FIG. 7 is a schematic diagram of a preferred embodiment of the pulse detector 22. The pulse detector 22 comprises inverters 40, 42, 43, 45, 46 and 47 and pass gates 41 and 44. Each pass gate is composed of an n-channel metal-oxide semiconductor field-effect transistor (MOSFET) and a p-channel MOSFET with the sources and drains of the two transistors connected. The pulse detector 22 is essentially a rising-edge triggered latch with the latch input receiving the binary complement of the latch output signal. This embodiment of the pulse detector 22 is well-known in the art and thus will be described only briefly.

The elements of the pulse detector 22 are connected as follows. The input IN of the pulse detector 22 is connected to the gate of the p-channel transistor of pass gate 41, the gate of the n-channel transistor of pass gate 44 and the input of the inverter 40. The output of the inverter 40 is connected to the gate of the n-channel transistor of pass gate 41 and the gate of the p-channel transistor of pass gate 44. The input of the pass gate 41 is connected to the output of the inverter 47. The output of the pass gate 41 is connected to both the input of the inverter 42 and the output of the inverter 43. The output of the inverter 42 and the input of the inverter 43 are both connected to the input of the pass gate 44. The output of the pass gate 44 is connected to both the input of the inverter 45 and the output of the inverter 46. The output of the inverter 45 and the input of the inverter 46 are both connected to the output OUT of the pulse detector 22, as well as to the input of the inverter 47. As a consequence, the output OUT of the pulse detector 22 transitions between 0 V and $V_{DD}$ (i.e., from 0 V to $V_{DD}$ or vice versa) whenever the input IN transitions from 0 V to $V_{DD}$.

Functionally, when the input IN is high, the data stored by the inverters 42 and 43 is copied into the inverters 45 and 46. When the input IN goes low, the data stored by the inverters 45 and 46 is inverted and copied into the inverters 42 and 43, leaving the inverters 42 and 43 in the opposite state of the inverters 45 and 46.

Figure 8:
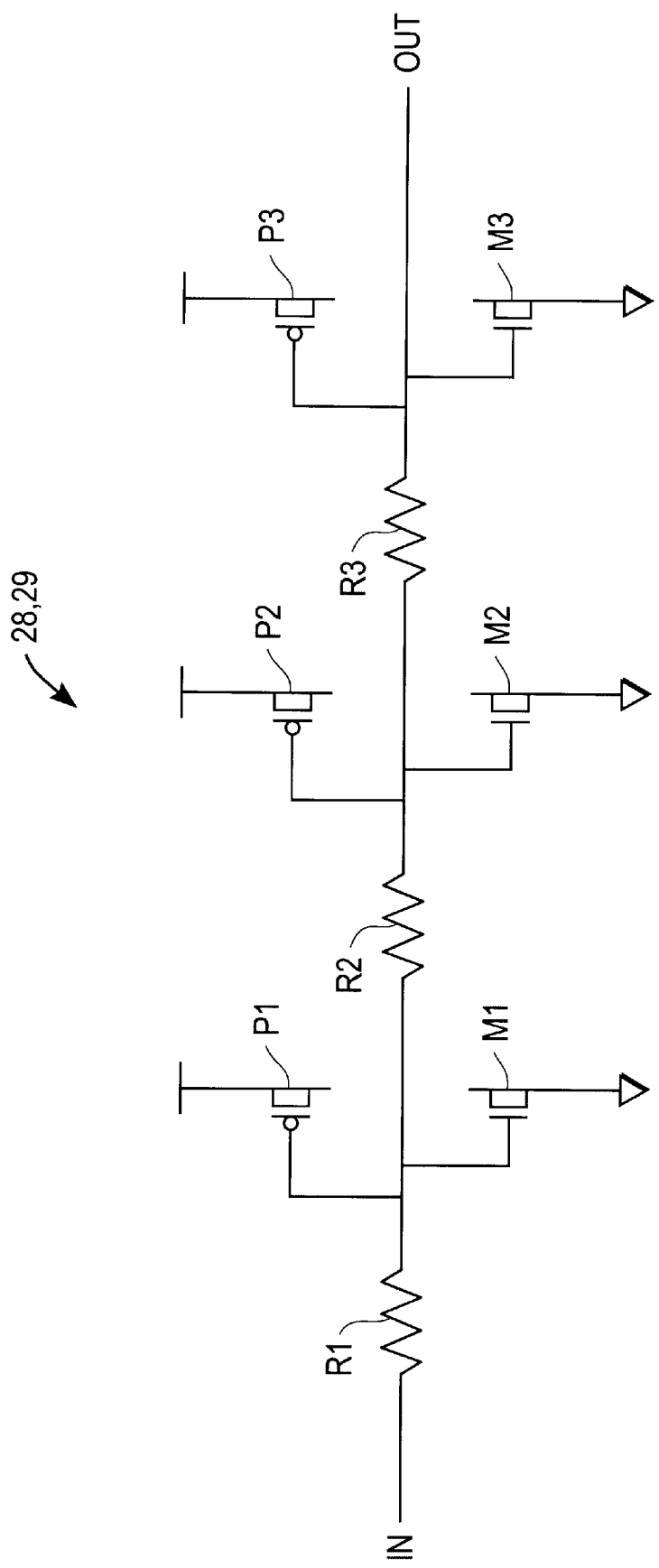
FIG. 8 is a schematic diagram of a preferred embodiment of the RC network shown in FIGS. 4 and 6.

FIG. 8 is a schematic diagram of a preferred embodiment of the RC networks 28 and 29. The RC networks 27 and 28 each comprise resistors R1, R2 and R3, p-channel MOSFETs P1, P2 and P3 and n-channel MOSFETs M1, M2 and M3. The transistors P1, P2, P3, M1, M2 and M3 are used as capacitive loads. Thus, the sources and drains of the p-channel transistors P1, P2 and P3 are connected to a power supply source $V_{DD}$ and the sources and drains of the n-channel transistors M1, M2 and M3 are connected to a ground source GND. The resistors R1, R2 and R3 and transistors P1, P2, P3, M1, M2 and M3 are connected in a typical RC network configuration. Although this embodiment uses three RC stages, a different number of stages may also be used.

The elements of the RC networks 28 and 29 are connected as follows. The input IN is connected to a first end of the resistor R1. A second end of the resistor R1 is connected to the gates of the transistors P1 and M1 and a first end of the resistor R2. A second end of the resistor R2 is connected to the gates of the transistors P2 and M2 and a first end of the resistor R3. A second end of the resistor R3 is connected to the gates of the transistors P3 and M3 and the output OUT of the RC network. The time constant of the RC networks 28 and 29 is approximately equal to:

$$R1*(C_{P1}+C_{M1}+C_{P2}+C_{M2}+C_{P3}+C_{M3})+R2*(C_{P2}+C_{M2}+C_{P3}+C_{M3}),$$

where R1, R2 and R3 are the resistances of the respective resistors and $C_{P1}$, $C_{M1}$, $C_{P2}$, $C_{M2}$, $C_{P3}$ and $C_{M3}$ are the gate capacitances of the respective transistors.

Figure 9:
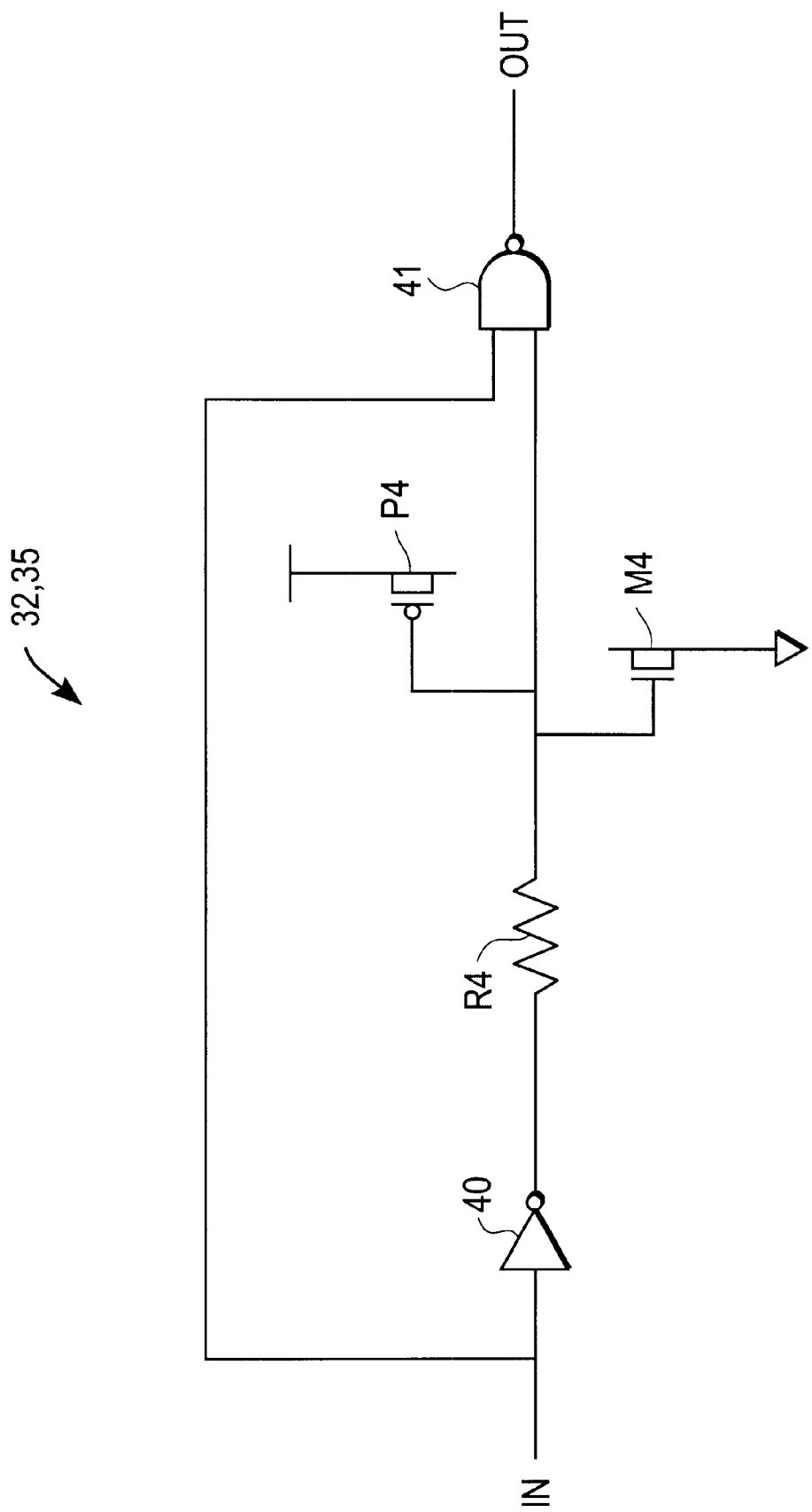
FIG. 9 is a schematic diagram of a preferred embodiment of the pulse generator shown in FIGS. 4 and 6.

FIG. 9 is a schematic diagram of a preferred embodiment of the pulse generators 32 and 35. The pulse generators 32 and 35 each comprise an inverter 40, a resistor R4, a p-channel MOSFET P4, an n-channel MOSFET M4 and a NAND gate 41. This embodiment of the pulse generators 32 and 35 is well-known in the art and thus will be described only briefly.

The elements of the pulse generators 32 and 35 are connected as follows. The input IN is connected to both a first input of the NAND gate 41 and the input of the inverter 40. The output of the inverter 40 is connected to a first end of the resistor R4. A second end of the resistor R4 is connected to the gates of the transistors P4 and M4 and a second input of the NAND gate 41. The transistors P4 and M4 are used as capacitive loads. Thus, the source and drain of the transistor P4 are connected to $V_{DD}$ and the source and drain of the transistor M4 are connected to GND. The output of the NAND gate 41 is connected to the output OUT of the pulse generator. The resistor R4 and the transistors P4 and M4 together comprise an RC network having a time constant equal to $R4*(C_{P4}+CM_4)$, where R4 is the resistance of the resistor R4 and $C_{P4}$ and $C_{M4}$ are the gate capacitances of the respective transistors. The output OUT of the pulse generators 32 and 35 generates a pulse having a duration equal to the combined delay of the inverter 40 and the RC network whenever the input IN transitions from 0 V to $V_{DD}$ (i.e., a rising edge).

Table 1 shows a comparison of the delay $t_d$ produced by the pulse delay circuit 20 of the present invention and the prior art delay circuits mentioned earlier under varyin temperature and power supply voltage conditions. In this simulated example, the delay circuits are designed to produce a delay $t_d$ of 6 ns A periodic pulsed signal PD_IN having a period T of 15 ns and a pulse width $t_{p,IN}$ of 1.5 ns is input to the delay circuits. As seen from the table, the variation in the delay $t_d$ for the pulse delay circuit 20 is significantly smaller than the variation for the prior art delay circuits.

TABLE 1

| | Delay | | |
|---|---|---|---|
| Delay Circuit | $t_{d1}$ (temperature = 100° C., $V_{DD}$ = 2.8 V) | $t_{d2}$ (temperature = −10° C., $V_{DD}$ = 3.8 V) | $t_{d1}$−$t_{d2}$ |
| delay circuit 5 (inverter chain) | 6.81 ns | 3.83 ns | 2.98 ns |
| delay circuit 10 (RC network) | no output pulse | no output pulse | — |
| pulse delay circuit 20 | 6.78 ns | 5.77 ns | 1.01 ns |

In summary, the pulse delay circuit of the present invention comprises an RC delay circuit in combination with a pulse detector and a pulsed signal generator. This combination provides a delay that does not vary significantly under changing temperature, power supply voltage or process conditions and furthermore, is not significantly limited in duration.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:
1. A pulse delay circuit comprising,
   a pulse detector including an input for receiving a pulsed signal and an output for generating a leveled signal that transitions between a first voltage and a second voltage whenever the pulsed signal transitions from the first voltage to the second voltage;

an RC delay circuit including an input coupled to the output of the pulse detector and an output for generating a delayed leveled signal that transitions between the first voltage and the second voltage whenever the leveled signal transitions between the first voltage and the second voltage, separated by a delay at least partially determined by an RC time constant associated with the RC delay circuit; and a pulsed signal generator including an input coupled to the output of the RC delay circuit and an output for generating a delayed pulsed signal containing a pulse of a predetermined width whenever the delayed leveled signal transitions from the first voltage to the second voltage and whenever the delayed leveled signal transitions from the second voltage to the first voltage.

2. The pulse delay circuit of claim 1, wherein the first voltage represents a logical low state and the second voltage represents a logical high state.

3. The pulse delay circuit of claim 1, wherein the first voltage represents a logical high state and the second voltage represents a logical low state.

4. The pulse delay circuit of claim 1, wherein the RC delay circuit comprises at least one resistor and at least one capacitor configured to provide the RC time constant.

5. A pulse delay circuit comprising, a pulse detector including an input for receiving a pulsed signal and an output for generating a leveled signal that transitions between a first voltage and a second voltage whenever the pulsed signal transitions from the first voltage to the second voltage;

an RC delay circuit including an input coupled to the output of the pulse detector and an output for generating a delayed leveled signal that transitions between the first voltage and the second voltage whenever the leveled signal transitions between the first voltage and the second voltage, separated by a delay at least partially determined by an RC time constant associated with the RC delay circuit; and a pulsed signal generator including an input coupled to the output of the RC delay circuit and an output for generating a delayed pulsed signal containing a pulse of a predetermined width whenever the delayed leveled signal transitions in at least one direction between the first voltage and the second voltage;

wherein the pulsed signal generator comprises:
a first pulse generator including an input coupled to the input of the pulsed signal generator and an output for generating a pulse of the predetermined width whenever the signal received at the input transitions from the first voltage to the second voltage;
a first inverter including an input coupled to the input of the pulsed signal generator and an output;
a second pulse generator including an input coupled to the output of the inverter and an output for generating a pulse of the predetermined width whenever the signal received at the input transitions from the first voltage to the second voltage; and
a logic circuit including a first input coupled to the output of the first pulse generator, a second input coupled to the output of the second pulse generator and an output for generating a signal that combines the signals received at the first and second inputs.

6. A pulse delay circuit comprising, a pulse detector including an input for receiving a pulsed signal and an output for generating a leveled signal that transitions between a first voltage and a second voltage whenever the pulsed signal transitions from the first voltage to the second voltage;

an RC delay circuit including an input coupled to the output of the pulse detector and an output for generating a delayed leveled signal that transitions between the first voltage and the second voltage whenever the leveled signal transitions between the first voltage and the second voltage, separated by a delay at least partially determined by an RC time constant associated with the RC delay circuit; and a pulsed signal generator including an input coupled to the output of the RC delay circuit and an output for generating a delayed pulsed signal containing a pulse of a predetermined width whenever the delayed leveled signal transitions in at least one direction between the first voltage and the second voltage;

wherein the pulsed signal generator comprises:
a first pulse generator including an input coupled to the input of the pulsed signal generator and an output for generating a pulse of the predetermined width whenever the signal received at the input transitions from the first voltage to the second voltage;
a first inverter including an input coupled to the input of the pulsed signal generator and an output;
a second pulse generator including an input coupled to the output of the inverter and an output for generating a pulse of the predetermined width whenever the signal received at the input transitions from the first voltage to the second voltage;
a NAND gate including a first input coupled to the output of the first pulse generator, a second input coupled to the output of the second pulse generator and an output;
a second inverter including an input coupled to the output of the NAND gate and an output; and
a third inverter including an input coupled to the output of the second inverter and an output coupled to the output of the pulsed signal generator.

7. A pulse delay circuit comprising, a pulse detector including an input for receiving a pulsed signal and an output for generating a leveled signal that transitions between a first voltage and a second voltage whenever the pulsed signal transitions from the first voltage to the second voltage;

an RC delay circuit including an input coupled to the output of the pulse detector and a first output for generating a delayed leveled signal that transitions in a first direction between the first voltage and the second voltage whenever the leveled signal transitions in the first direction between the first voltage and the second voltage, separated by a delay at least partially determined by a first RC time constant associated with the RC delay circuit; and a pulsed signal generator including an input coupled to the output of the RC delay circuit and an output for generating a delayed pulsed signal containing a pulse of a predetermined width whenever the delayed leveled signal transitions in at least one direction between the first voltage and the second voltage;

wherein:
the RC delay circuit further includes a second output for generating a second delayed leveled signal that transitions in the first direction between the first voltage and the second voltage whenever the leveled signal transitions between the first voltage and the second voltage in a direction opposite the first direction, separated by a delay at least partially determined by a second RC time constant associated with the RC delay circuit; and the pulsed signal generator further includes a second input coupled to the second output of the RC delay circuit, wherein the output of the pulsed signal generator generates a pulse whenever either the first or second delayed leveled signal transitions from the first voltage to the second voltage.

8. The pulse delay circuit of claim 7, wherein the RC delay circuit comprises:

a first RC network including an input coupled to the input of the RC delay circuit, an output coupled to the output of the RC delay circuit and at least one resistor and at least one capacitor configured to provide the RC time constant;

an inverter including an input coupled to the input of the RC delay circuit and an output; and a second RC network including an input coupled to the output of the inverter an output coupled to the second output of the RC delay circuit and at least one resistor and at least one capacitor configured to provide the second RC time constant.

9. The pulse delay circuit of claim 7, wherein the pulsed signal generator comprises:

a first pulse generator including an input coupled to the input of the pulsed signal generator and an output for generating a pulse of the predetermined width whenever the signal received at the input transitions from the first voltage to the second voltage;

a second pulse generator including an input coupled to the second input of the pulsed signal generator and an output for generating a pulse of the predetermined width whenever the signal received at the second input transitions from the first voltage to the second voltage; and a logic circuit including a first input coupled to the output of the first pulse generator, a second input coupled to the output of the second pulse generator and an output for generating a signal that combines the signals received at the first and second inputs.

10. The pulse delay circuit of claim 7, wherein the pulsed signal generator comprises:

a first pulse generator including an input coupled to the input of the pulsed signal generator and an output for generating a pulse of the predetermined width whenever the signal received at the input transitions from the first voltage to the second voltage;

a second pulse generator including an input coupled to the second input of the pulsed signal generator and an output for generating a pulse of the predetermined width whenever the signal received at the second input transitions from the first voltage to the second voltage;

a NAND gate including a first input coupled to the output of the first pulse generator, a second input coupled to the output of the second pulse generator and an output;

a second inverter including an input coupled to the output of the NAND gate and an output; and a third inverter including an input coupled to the output of the second inverter and an output coupled to the output of the pulsed signal generator.

* * * * *